US008531919B2

(12) United States Patent
Cheng et al.

(10) Patent No.: US 8,531,919 B2

(45) Date of Patent: Sep. 10, 2013

(54) FLEXIBLE CAPACITIVE MICROMACHINED ULTRASONIC TRANSDUCER ARRAY WITH INCREASED EFFECTIVE CAPACITANCE

(75) Inventors: Ching-Hsiang Cheng, Hong Kong (HK); Chen Chao, Hong Kong (HK)

(73) Assignee: The Hong Kong Polytechnic University, Hong Kong (HK)

( * ) Notice: Subject to any disclaimer, the term of this patent is extended or adjusted under 35 U.S.C. 154(b) by 542 days.

(21) Appl. No.: 12/885,798

(22) Filed: Sep. 20, 2010

(65) Prior Publication Data

US 2011/0068654 A1 Mar. 24, 2011

Related U.S. Application Data

(60) Provisional application No. 61/272,404, filed on Sep. 21, 2009.

(51) Int. Cl.
*H01L 41/08* (2006.01)

(52) U.S. Cl.
USPC .......... 367/181

(58) Field of Classification Search
USPC .......... 367/181; 438/22, 48; 257/416; 310/300
See application file for complete search history.

(56) References Cited

U.S. PATENT DOCUMENTS

| | | | |
|---|---|---|---|
| 5,619,476 | A | 4/1997 | Haller et al. |
| 5,870,351 | A | 2/1999 | Ladabaum et al. |
| 5,894,452 | A | 4/1999 | Ladabaum et al. |
| 5,982,709 | A | 11/1999 | Ladabaum et al. |
| 6,004,832 | A | 12/1999 | Haller et al. |
| 6,262,946 | B1 | 7/2001 | Khuri-Yakub et al. |
| 6,271,620 | B1 | 8/2001 | Ladabaum |
| 6,295,247 | B1 | 9/2001 | Khuri-Yakub et al. |
| 6,314,057 | B1 | 11/2001 | Solomon et al. |
| 6,426,582 | B1 | 7/2002 | Niederer et al. |
| 6,430,109 | B1 | 8/2002 | Khuri-Yakub et al. |
| 6,443,901 | B1 | 9/2002 | Fraser |
| 6,493,288 | B2 | 12/2002 | Khuri-Yakub et al. |
| 6,558,330 | B1 | 5/2003 | Ayter et al. |
| 6,632,178 | B1 | 10/2003 | Fraser |
| 6,659,954 | B2 | 12/2003 | Robinson |
| 6,958,255 | B2 | 10/2005 | Khuri-Yakub et al. |
| 7,030,536 | B2 | 4/2006 | Smith et al. |
| 7,037,746 | B1 | 5/2006 | Smith et al. |
| 7,074,634 | B2 | 7/2006 | Foglietti et al. |
| 7,285,897 | B2 | 10/2007 | Fisher et al. |
| 7,321,181 | B2 | 1/2008 | Khuri-Yakub et al. |
| 7,332,850 | B2 | 2/2008 | Ladabaum et al. |
| 7,477,572 | B2 | 1/2009 | Caronti et al. |
| 7,489,593 | B2 | 2/2009 | Nguyen-Dinh et al. |
| 7,493,821 | B2 | 2/2009 | Wang |

(Continued)

FOREIGN PATENT DOCUMENTS

| | | | |
|---|---|---|---|
| CN | 1714754 | A | 1/2006 |
| WO | WO2009/016606 | A2 | 2/2009 |
| WO | WO2009/077961 | A2 | 6/2009 |

*Primary Examiner* — Daniel Pihulic

(74) *Attorney, Agent, or Firm* — Muncy, Geissler, Olds & Lowe, PLLC

(57) ABSTRACT

A Capacitive Micromachined Ultrasonic Transducer (CMUT) having a membrane operatively connected to a top electrode and having a bottom electrode having a concave void. When a DC bias voltage is applied, the membrane is deflected towards the bottom electrode such that a peripheral edge region of the membrane is brought into close proximity with the bottom electrode and an electrostatic force proximal to the peripheral edge region of the membrane is increased.

16 Claims, 9 Drawing Sheets

(56) References Cited

U.S. PATENT DOCUMENTS

| | | | | |
|---|---|---|---|---|
| 2005/0200241 | A1 | 9/2005 | Degertekin | |
| 2006/0004289 | A1* | 1/2006 | Tian et al. | 600/459 |
| 2007/0164631 | A1* | 7/2007 | Adachi et al. | 310/311 |
| 2007/0164632 | A1* | 7/2007 | Adachi et al. | 367/140 |
| 2011/0068654 | A1* | 3/2011 | Cheng et al. | 310/300 |

* cited by examiner

FLEXIBLE CAPACITIVE MICROMACHINED ULTRASONIC TRANSDUCER ARRAY WITH INCREASED EFFECTIVE CAPACITANCE

CROSS REFERENCE TO RELATED APPLICATIONS

This application claims priority of U.S. Provisional Application No. 61/272,404 filed on Sep. 21, 2009 under 35 U.S.C. §119(e), the entire contents of which are hereby incorporated by reference.

BACKGROUND OF THE INVENTION

1. Field of the Invention

The invention relates to an improved a Capacitive Micromachined Ultrasonic Transducer (CMUT) and method for manufacturing the CMUT.

2. Description of the Background Art

FIGS. 1 to 3 illustrate a conventional working principle of a Capacitive Micromachined Ultrasonic Transducer (CMUT) 100 with a flat bottom electrode 140.

Referring to FIG. 1, a CMUT 100 is similar to a parallel plate capacitor having a top electrode 110 on a dielectric membrane 120 that is isolated by a vacuum or air cavity 130 to a bottom electrode 140. The bottom electrode 140 is usually formed on a flat conductive substrate. The top electrode 110 and the bottom electrode 140 may be made from a conductive material such as a conductive silicon substrate. The membrane 120 is made from conductive material or is coated with a conductive material. When actuated by electrostatic force with an AC voltage, the membrane 120 can vibrate to generate ultrasound like a drum diaphragm. Therefore, the CMUT 100 can be used as an ultrasound emitter and receiver. Only 25% of the area near the center of the membrane 120 is patterned with a top electrode 110 since the remaining 75% area has much less capacitance change, which is considered as parasitic capacitance to be removed. In other words, only 25% of the central area of the membrane 120 is patterned with a top electrode 110 to conduct effective capacitance.

In FIG. 2, when a DC bias voltage is applied, the electrostatic force pushes the membrane 120 toward the bottom electrode 140. The effective capacitance is inversely proportional to the gap distance of the air cavity 130 between the top electrode 110 and the bottom electrode 140. In other words, effective capacitance can be achieved only when the gap distance is small. Only the middle section of membrane 120 can produce effective capacitance even if the entire membrane 120 is patterned with top electrode 110 because the bottom electrode 140 has a flat bottom. For instance, the capacitance produced in area 150 is considered parasitic capacitance.

To increase the sensitivity, the DC bias voltage is applied to load up the capacitor with charges, which can also pull the membrane 120 closer to the bottom electrode 140 to get a higher capacitance. The maximum sensitivity can be achieved when the membrane 120 is closest to the bottom electrode 140 without collapsing to the bottom electrode 140.

As the DC bias voltage increases, deflection of the membrane 120 also increases. However, when the DC bias voltage is increased above a certain voltage, electrostatic forces pressure the membrane 120 to collapse on the bottom electrode 140.

FIG. 3 illustrates a situation where the DC bias voltage is used to collapse the membrane 120. As a result, the contribution of the affected areas 160 to the effective capacitance is significantly reduced. When the DC bias voltage is large enough to bring the membrane 120 to be deflected to more than ⅓ of the gap distance of the air gap 130, the membrane 120 will collapse and make contact with the bottom electrode 140.

FIG. 4 illustrates the conventional CMUT arrays. The top electrodes 310 can only cover part of the membrane.

Referring to FIG. 5, the capacitance is simply a series combination of two parallel plate capacitors, capacitance $C_1$ is the capacitance of dielectric membrane, and $C_2$ is the capacitance of the air cavity, where $d_1$ is the thickness of the membrane, $d_2$ is the depth of the air cavity, b is the radius of the top electrode, $\in_1$ and $\in_2$ are the relative dielectric constants, $\in_0$ is the vacuum permittivity.

$$C = \frac{1}{\frac{1}{C_1} + \frac{1}{C_2}} = \frac{1}{\frac{1}{\varepsilon_0\varepsilon_1\frac{A}{d_1}} + \frac{1}{\varepsilon_0\varepsilon_2\frac{A}{d_2}}} = \frac{\pi\varepsilon_0 b^2}{\frac{d_1}{\varepsilon_1} + \frac{d_2}{\varepsilon_2}}$$

Referring to FIG. 6, for a flat bottom electrode with deflected membrane of a conventional CMUT, the deflected circular membrane is assumed to be a spherical shell partially covered by the top electrode, where $R_a$ is the inner shell radius, $R_b$ is the outer shell radius, and h is the height of the inner shell. $C_1$ from the deflected dielectric membrane is calculated by the equation of parallel plate capacitor with the area of the partial spherical shell.

$$C_1 = 4\pi\varepsilon_0\varepsilon_1 h\frac{R_a R_b}{d_1}$$

The capacitance in the air cavity between the bottom of the deflected membrane with radius $R_b$ and the flat bottom electrode is calculated as follows.

$C_2$=(The parallel plate capacitance between the flat bottom electrode and the virtual flat plate (dashed line))−(The capacitance between the spherical shell with radius $R_b$ and the virtual flat plate).

$$C_2 = \frac{1}{\frac{1}{\varepsilon_0\varepsilon_2\frac{\pi b^2}{d_2}} - \frac{1}{2\pi\varepsilon_0\varepsilon_2 R_b \ln\frac{H}{\sqrt{R_b^2 - b^2} - \sqrt{R_b^2 - a^2}}}}$$

$$C = \frac{1}{\frac{1}{C_1} + \frac{1}{C_2}} = \frac{\pi\varepsilon_0}{\frac{d_1}{4\varepsilon_1 h R_a R_b} + \frac{d_2}{\varepsilon_2 b^2} - \frac{1}{2\varepsilon_2 R_b \ln\frac{H}{\sqrt{R_b^2 - b^2} - \sqrt{R_b^2 - a^2}}}}$$

where $$R_a = \frac{1}{2H}(H^2 + a^2),\ R_b = R_a + d_1,\ h = R_a - \sqrt{R_a^2 - b^2}$$

FIG. 7 is a graph of effective capacitance with respect to membrane deflection of a conventional CMUT with flat bottom electrodes. The diameter of the silicon nitride membrane is 100 μm, the thickness of the membrane is 0.2 μm, and the depth of the air cavity is 1 μm. These values are applied into the derived equations above. The relative dielectric constant of silicon nitride film is 7.5. For CMUTs with flat bottom electrodes, the capacitance change reaches its maximum of 22% when the diameter of the top electrode is 84 μm. The capacitance change drops to 9% when the top electrode fills the membrane. The maximum capacitance at the collapsed mode can only reach 0.075 pF.

SUMMARY OF THE INVENTION

It is therefore an object of the present invention to provide a Capacitive Micromachined Ultrasonic Transducer (CMUT), that includes a membrane operatively connected to a top electrode; and a bottom electrode having a concave void. Whereby, when a DC bias voltage is applied, the membrane is deflected towards the bottom electrode such that a peripheral edge region of the membrane is brought into close proximity with the bottom electrode and an electrostatic force proximal to the peripheral edge region of the membrane is increased.

When the DC bias voltage is applied, the distance between the peripheral edge region of the membrane and the bottom electrode may be less than the distance between a central region of the membrane and the bottom electrode.

When the DC bias voltage applied is above a predetermined amount to collapse the membrane to the bottom electrode, contact between the membrane and the bottom electrode may be minimised to a central region of the membrane.

About 25% of the membrane is in contact with the bottom electrode when the membrane is collapsed to the bottom membrane.

The top electrode may have the same diameter as the void of the bottom electrode.

The membrane may be flat or deflected.

The size of the membrane may be from about 500 μm to 5 μm with a frequency range from 100 kHz up to 100 MHz in air.

The thickness of the membrane may be from about 0.1 μm to 10 μm.

The CMUT may have an array of membranes where each top electrode fills the entire area of each membrane leaving only small voids for anchoring each membrane.

In another embodiment, a method for manufacturing a Capacitive Micromachined Ultrasonic Transducer (CMUT) is provided, whereby the method includes the features of sputtering a layer of Cr/Au as a seed layer on a silicon substrate that includes a layer of silicon nitride to form a CMUT membrane; coating a patterned photoresist to define the active area of a CMUT cell; melting the patterned photoresist to form a spherical profile by surface tension; and electroplating of nickel with the seed layer to form the bottom electrode by over-plating to cover the patterned photoresist.

The Young's modulus of the silicon nitride may be around 200 GPa.

The method may further include sealing released holes caused by the electroplating using a silicone-based polydimethylsiloxane (PDMS) with air trapped in CMUT cavities.

The method may further include coating parylene C in a vacuum chamber.

The method may further include removing the silicon substrate by single-side potassium hydroxide (KOH) etching that stops at the silicon nitride membrane.

The method may further include patterning the PDMS to define a membrane area and array elements.

The method may further include wire bonding to front-end electronics.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
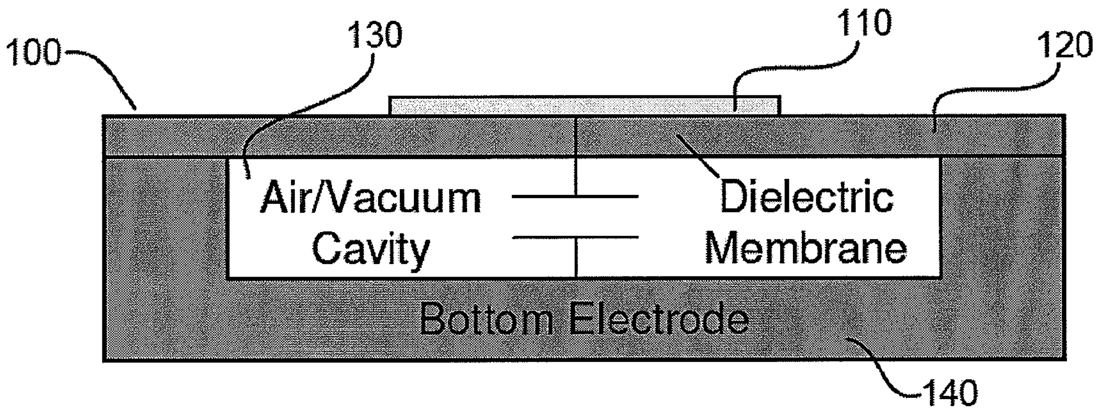
FIG. 1 illustrates the conventional working principle of CMUT with a flat bottom electrode.
Figure 2:
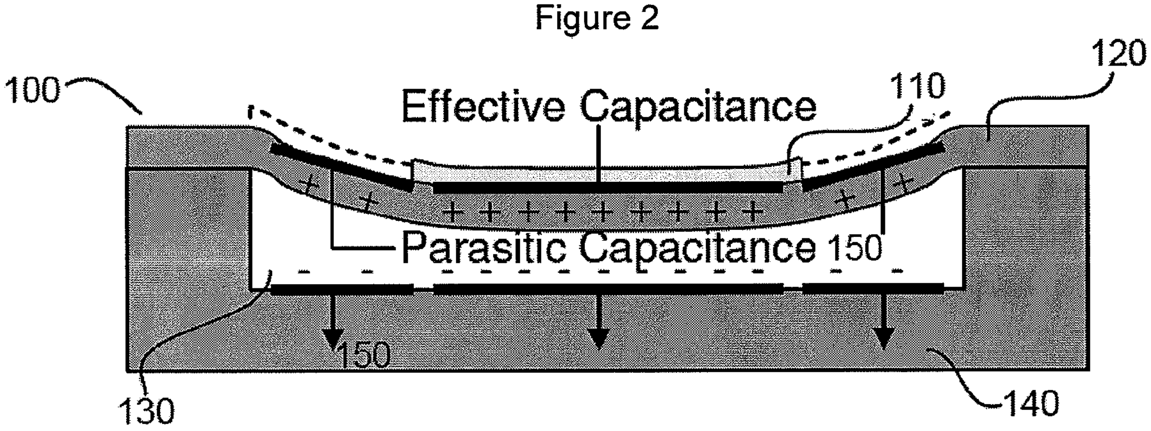
FIG. 2 illustrates the conventional working principle of CMUT with a flat bottom electrode when DC bias is applied.
Figure 3:
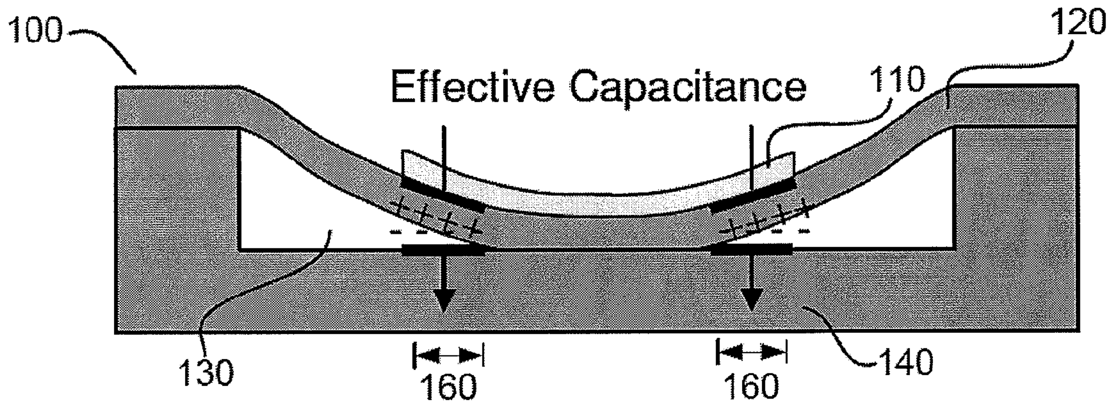
FIG. 3 illustrates the conventional working principle of CMUT with a flat bottom electrode when DC biasing is applied to collapse the membrane.
Figure 4:
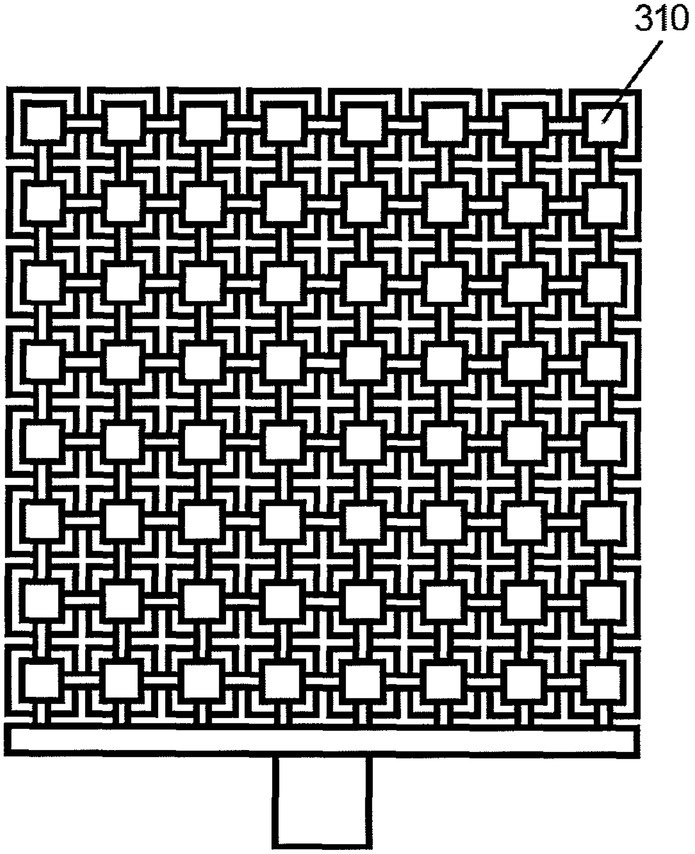
FIG. 4 illustrates the conventional CMUT array arrangement.
Figure 5:
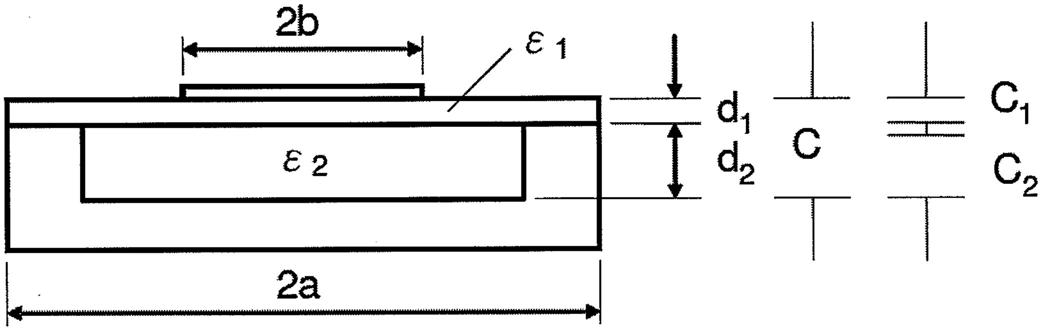
FIG. 5 illustrate the conventional working principle of CMUT with a flat bottom electrode.
Figure 8:
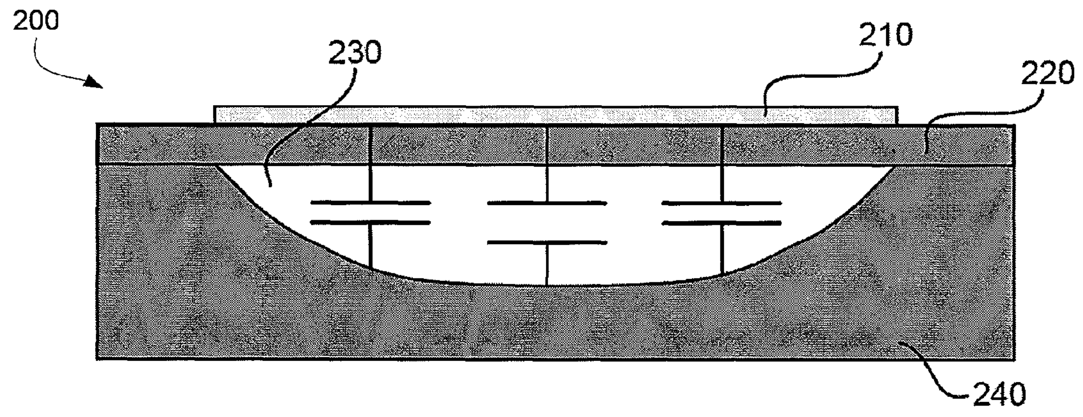
FIG. 8 illustrate a CMUT with a concave bottom electrode in accordance with an embodiment of the present invention.
Figure 9:
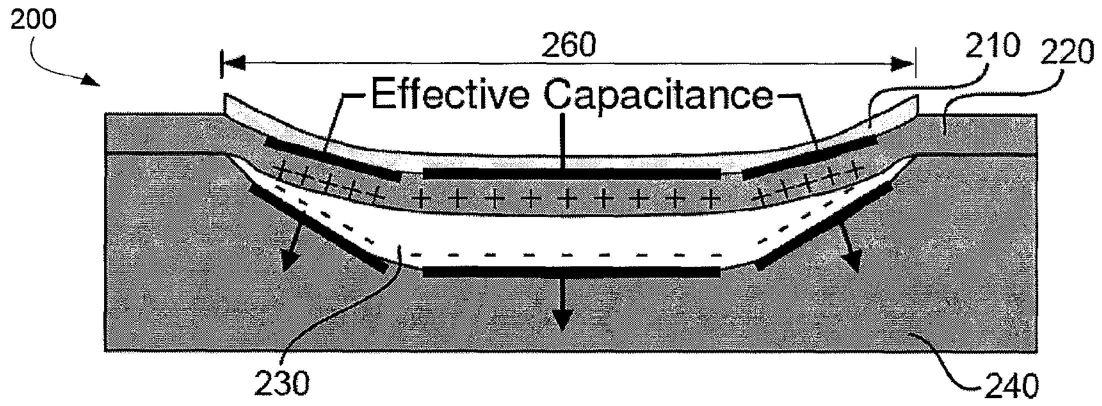
FIG. 9 illustrate a CMUT with a concave bottom electrode in accordance with an embodiment of the present invention when DC bias is applied.
Figure 10:
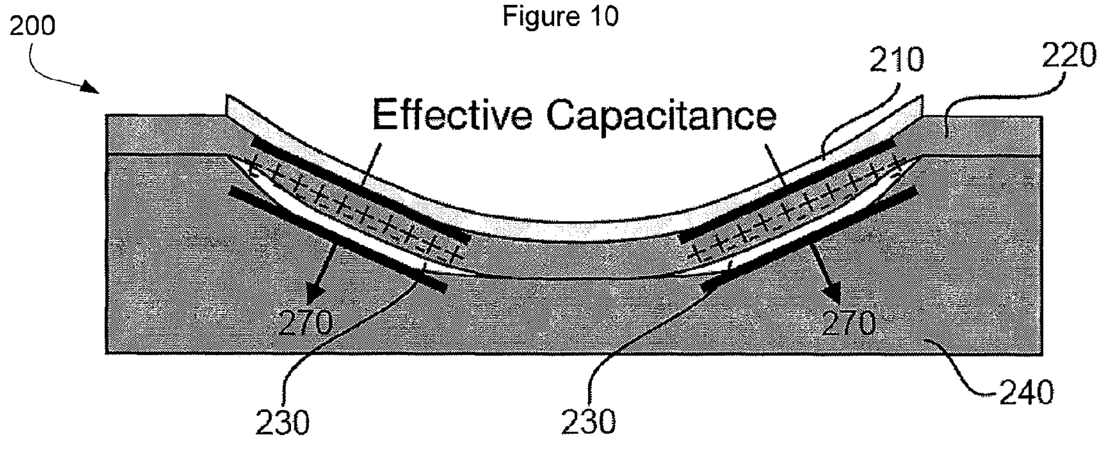
FIG. 10 illustrate a CMUT with a concave bottom electrode in accordance with an embodiment of the present invention when DC biasing is applied to collapse the membrane.

Referring to FIGS. 8 to 10, a Capacitive Micromachined Ultrasonic Transducer (CMUT) 200 with a concave shaped bottom electrode 240 is depicted. A concave air cavity 230 is defined by the concavity of the bottom electrode 240. Turning to FIG. 8, the top electrode 210 covers 100% of the area 260 of the membrane 220 above the air cavity 230. Consequently, the effective capacitance for the CMUT 200 can be significantly higher than the conventional CMUT 100 of FIG. 1 with a top electrode 110 which covers only 25% of the membrane area 120.

Turning to FIG. 9, when direct current (DC) bias is applied, the entire area 260 of the membrane 220 above the air cavity 230 is considered to produce effective capacitance. The concavity of the bottom electrode 240 substantially conforms to the deflection of the membrane 220 when a DC bias voltage is applied.

If the bottom electrode 240 is defined with a concave shape or curved profile, and when the membrane 220 is deflected, the membrane 220 can fully comply and conform to the top surface of the bottom electrode 240, especially around the outer edge 270 of the membrane 220 above the air cavity 230. This can increase the electrostatic force around the edge 270 of the membrane 220 to pull down the membrane 220 so a smaller DC bias voltage can be used. Using a smaller DC bias voltage is essential when inserting the transducer probe into the human body for an intravascular application. The bandwidth of the CMUT 200 can also be improved since most of the membrane 220 is under the electrostatic force from the DC bias voltage, which can increase the tensile stress on the membrane 220 to reduce the ringing tail.

Turning to FIG. 10, when a DC bias voltage exceeds a certain voltage level, the membrane 220 is collapsed to the bottom electrode 240. In this situation, only approximately 25% of the membrane 220 is in contact with the bottom electrode 240. Hence, 75% of the membrane 220 which is the area 270 proximal to the peripheral edge (that is, the area 270 of the membrane 220 that is not in contact with the bottom electrode 240 above the air cavity 230) is considered as effective capacitance.

A CMUT can also operate at the collapsed mode to have an increased sensitivity and bandwidth. The sensitivity is increased from the increased capacitance at the minimum gap distance around the contacting area. The bandwidth can be improved because the movement of the membrane 220 can be damped by the bottom electrode 240 to reduce the ringing tail. When implementing the concave shaped bottom electrode 240 to operate CMUTs 200 at the collapsed mode, the whole membrane 220 is barely touching the bottom electrode 240 to increase the bandwidth and sensitivity. In particular, around the central area of the membrane 220 is damped by the bottom electrode 240. Thus, the CMUT 200 can increase effective capacitance to improve fill factor, output pressure, bandwidth, and sensitivity of the transducer.

The resonant frequency of the CMUT depends on the size and thickness of the membrane. The size of the membrane can range from 500 μm to 5 μm with a frequency range from 100 kHz up to 100 MHz in air. The thickness of the membrane can range from 0.1 μm to 10 μm. Since each membrane of the CMUT is very small, it requires an array of membranes for the CMUT to fill the area of a single transducer element.

Figure 11:
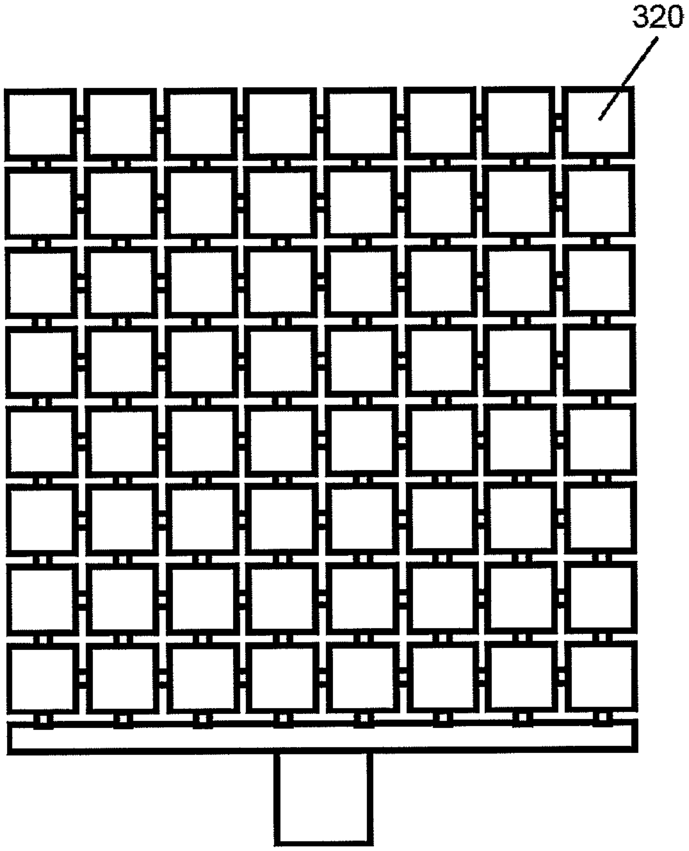
FIG. 11 illustrates an exemplary CMUT array arrangement in accordance with an embodiment of the present invention.

FIG. 11 illustrates exemplary CMUT arrays. The top electrode 320 can fill the whole area of the membrane leaving only small voids for anchoring the membrane, which increases the fill factor four times more than conventional CMUTs. The top electrode 320 can also be patterned to make a 1-D CMUT array for 2-D ultrasonic imaging. In addition, the electroplated bottom electrode can also be patterned to isolate 2-D array elements for 3-D ultrasonic imaging.

The capacitance of a parallel plate capacitor can be determined from the area of the effective capacitance A and the distance between the top and bottom electrodes d, which is expressed as follows:

$$C = \frac{Q}{V_{ab}} = \varepsilon_0 \varepsilon_r \frac{A}{d},$$

for series capacitor $$\frac{1}{C} = \frac{1}{C_1} + \frac{1}{C_2}$$

Based on the geometry of the CMUT, the capacitance of the CMUT can be calculated as follows, where the electrode diameter is much greater than the cavity depth ($2c>2b>>d_2$) and the capacitance $C_2$ is assumed to be a parallel-plate capacitor.

Figure 12:
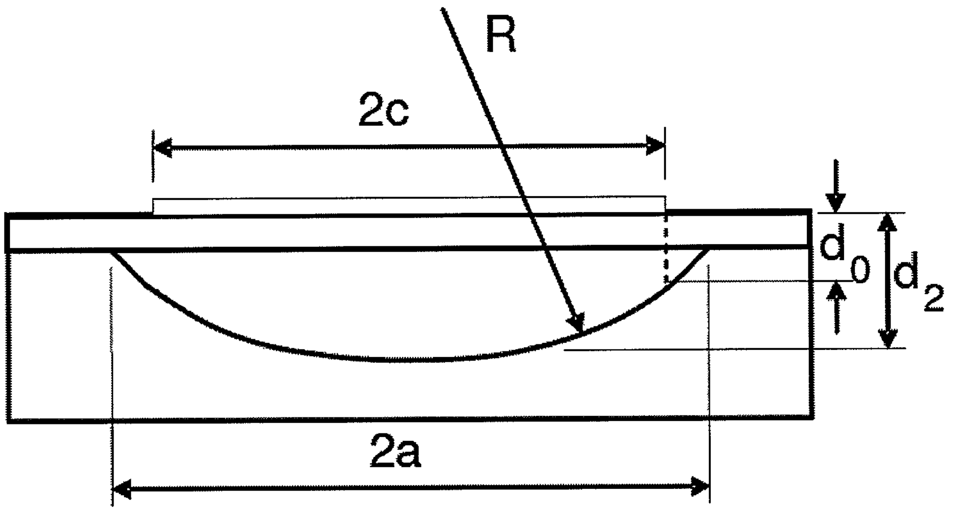
FIG. 12 illustrate the working principle of CMUT with a concave bottom electrode in accordance with an embodiment of the present invention.

Referring to FIG. 12, for a concave bottom electrode with a flat membrane, the capacitance from dielectric membrane $C_1$ is calculated by the parallel-plate capacitor equation. The capacitance $C_2$ between the bottom surface of the flat membrane to the concave bottom electrode with spherical surface is calculated also using the spherical shell to flat plate capacitance equation:

$$C_1 = \varepsilon_0 \varepsilon_1 \frac{\pi c^2}{d_1}$$

$$C_2 = 2\pi \varepsilon_0 \varepsilon_2 R \ln \frac{d_2}{d_0}$$

$$C = \frac{1}{\frac{1}{C_1} + \frac{1}{C_2}} = \frac{\pi \varepsilon_0}{\frac{d_1}{\varepsilon_1 c^2} + \frac{1}{2\varepsilon_2 R \ln \frac{d_2}{d_0}}}$$

where $$R = \frac{1}{2d_2}(d_2^2 + a^2),\ d_0 = \sqrt{R^2 - c^2} - R + d_2$$

Figure 6:
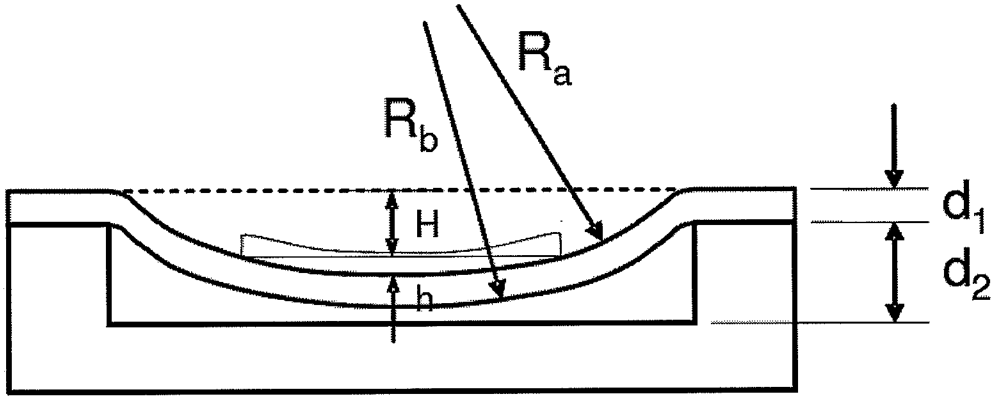
FIG. 6 illustrate the conventional working principle of CMUT with a flat bottom electrode.
Figure 7:
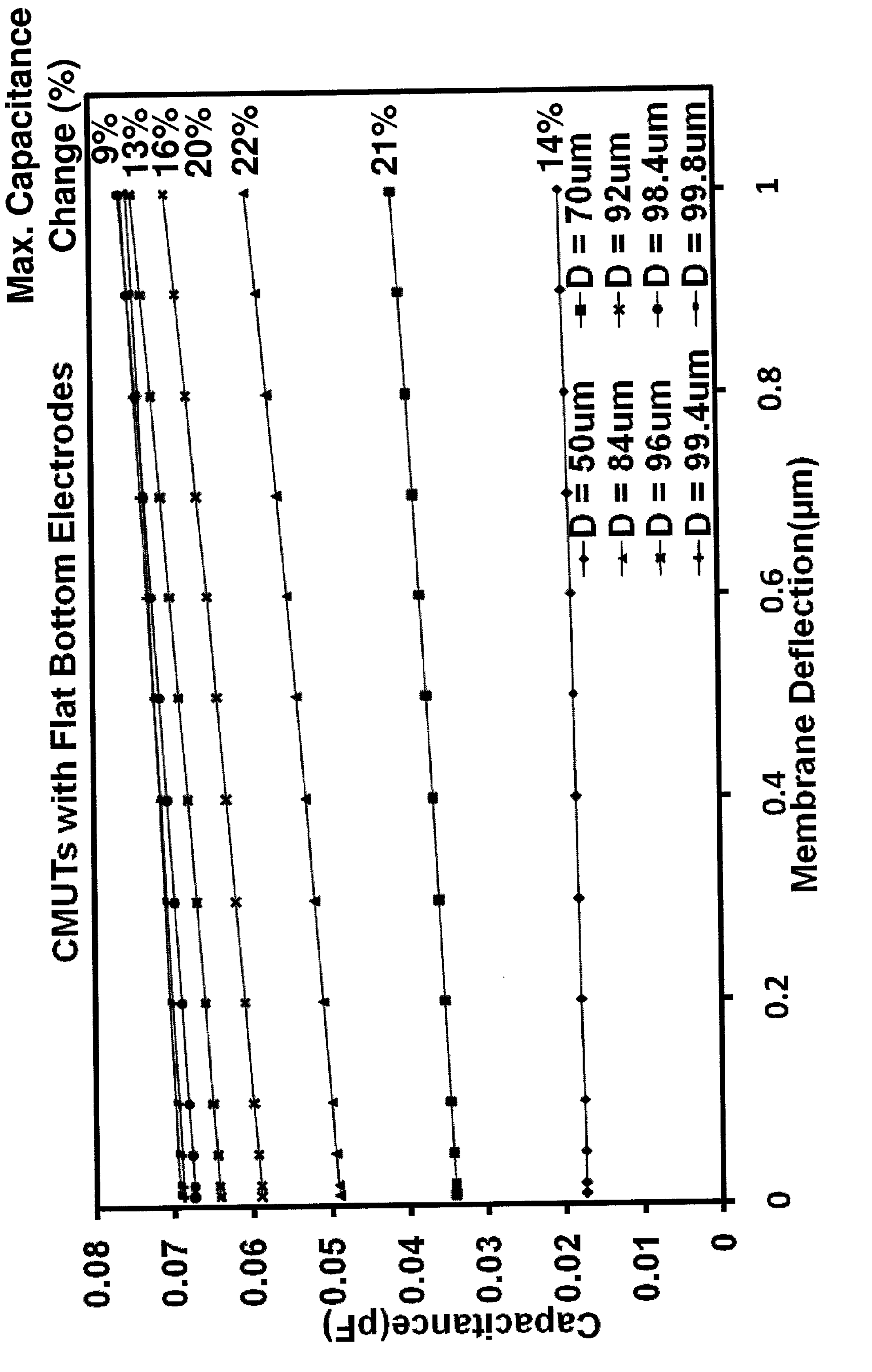
FIG. 7 illustrates a graph of effective capacitance with respect to membrane deflection of a conventional CMUT with a flat bottom electrode.
Figure 13:
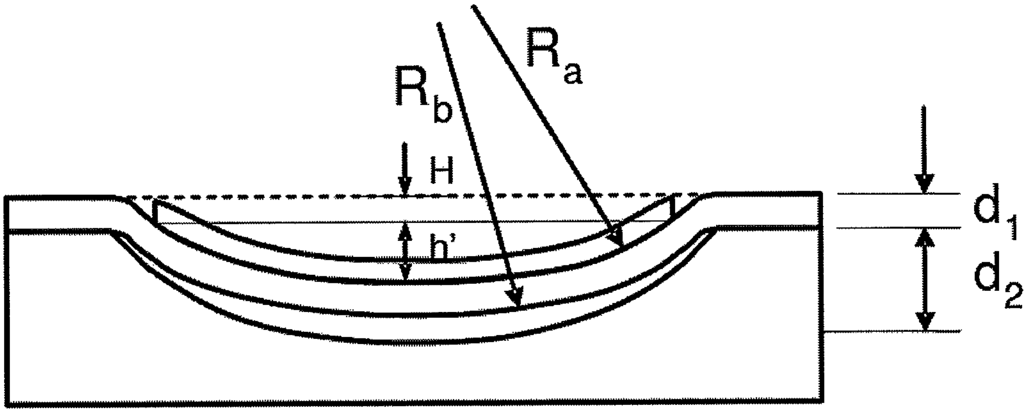
FIG. 13 illustrate the working principle of CMUT with a concave bottom electrode in accordance with an embodiment of the present invention.

Referring to FIG. 13, for a concave bottom electrode with a deflected membrane, the membrane is assumed to deform into a spherical shape similar to the case of FIG. 6. The concave bottom electrode is also assumed to have a spherical surface. For membrane capacitance $C_1$, it is calculated similar to FIG. 6 as described above. As to $C_2$, the cavity capacitance is first calculated relative to the virtual flat plate. Then, the cavity capacitance is subtracted with the capacitance between two spherical surfaces to obtain $C_2$. The equations for obtaining $C_1$ and $C_2$ are as follows:

$$C_1 = 4\pi \varepsilon_0 \varepsilon_1 h' \frac{R_a R_b}{d_1}$$

$C_2$=(The capacitance between the bottom electrode and the virtual flat plate (dashed line))−(The capacitance between the spherical shell with radius $R_b$ and the virtual flat plate).

$$C_2 = \frac{1}{\frac{1}{2\pi \varepsilon_0 \varepsilon_2 R \ln \frac{d_2}{d_0}} - \frac{1}{2\pi \varepsilon_0 \varepsilon_2 R_b \ln \frac{H}{\sqrt{R_b^2 - c^2} - \sqrt{R_b^2 - a^2}}}}$$

$$C = \frac{1}{\frac{1}{C_1} + \frac{1}{C_2}} = \frac{\pi \varepsilon_0}{\frac{d_1}{4\varepsilon_1 h' R_a R_b} + \frac{1}{2\varepsilon_2 R \ln \frac{d_2}{d_0}} - \frac{1}{2\varepsilon_2 R_b \ln \frac{H}{\sqrt{R_b^2 - c^2} - \sqrt{R_b^2 - a^2}}}}$$

where $$R_a = \frac{1}{2H}(H^2 + a^2),\ R_b = R_a + d_2,\ h' = R_a - \sqrt{R_a^2 - c^2}$$

Figure 14:
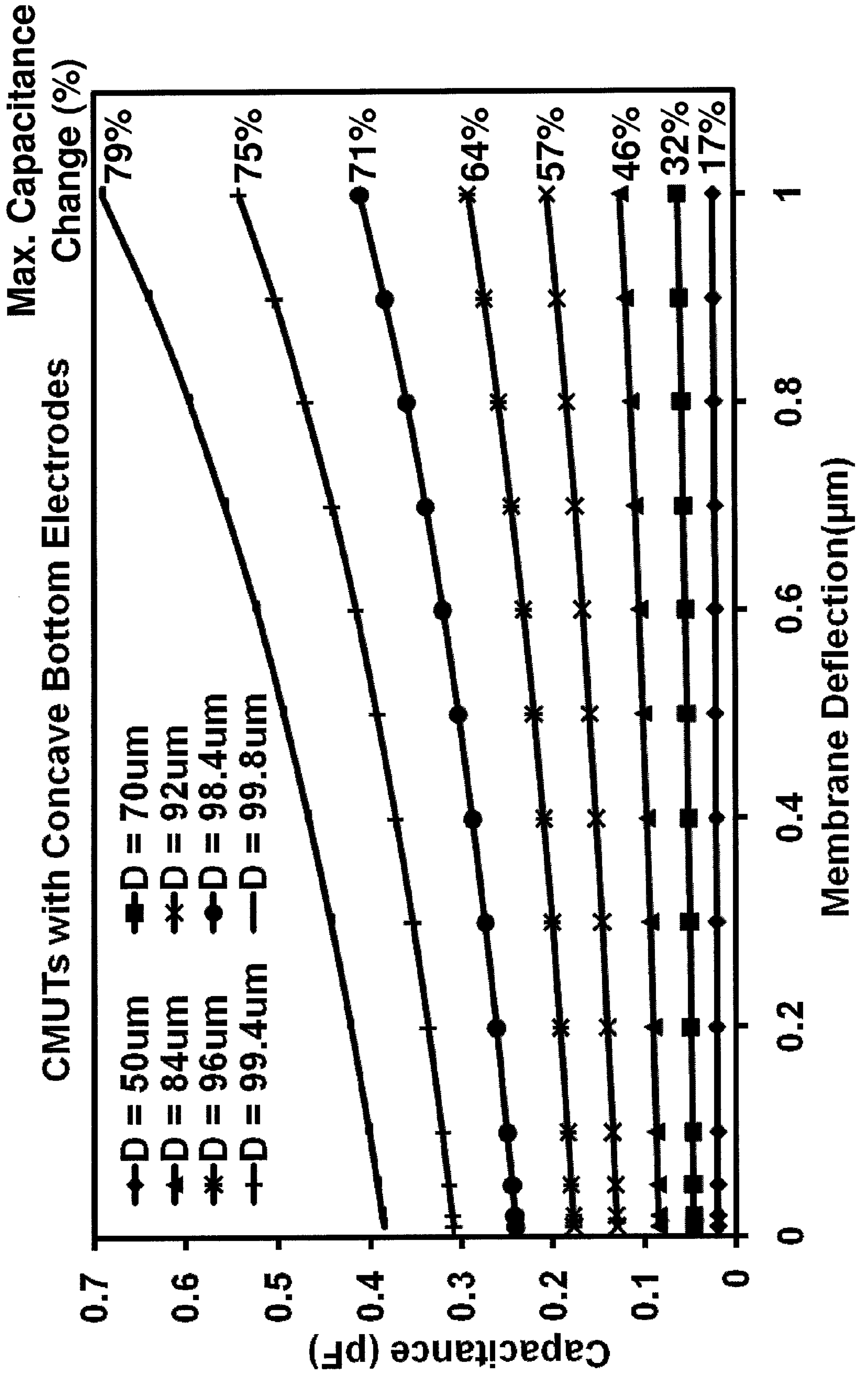
FIG. 14 illustrates a graph of effective capacitance with respect to membrane deflection of a CMUT with a concave bottom electrode in accordance with the present invention.

FIG. 14 illustrates a graph of effective capacitance with respect to membrane deflection of a CMUT with concave bottom electrodes. CMUTs using concave bottom electrodes the capacitance change can increase up to 79% when enlarging the diameter of the top electrode up to 99.8 μm. The maximum capacitance at the collapsed mode can reach up to 0.7 pF, which is almost ten times more compared to the CMUT using flat bottom electrodes. From Coulomb's Law, the electrostatic force of a parallel capacitor is expressed as follows, where Q is the electrical charge, E is the electrical field, and V is the voltage.

$$F = Q \cdot E = Q\frac{Q}{2A\varepsilon_0} = \frac{\varepsilon_0 A V^2}{2d^2}, \text{ where } Q = A\varepsilon_0\frac{V}{d}$$

For output pressure, since the electrostatic force is inversely proportional to the square of the cavity depth, which means shorten the cavity depth can estimate to have two orders of magnitude increase on the output pressure when the capacitance increase is one order of magnitude.

Figure 15:
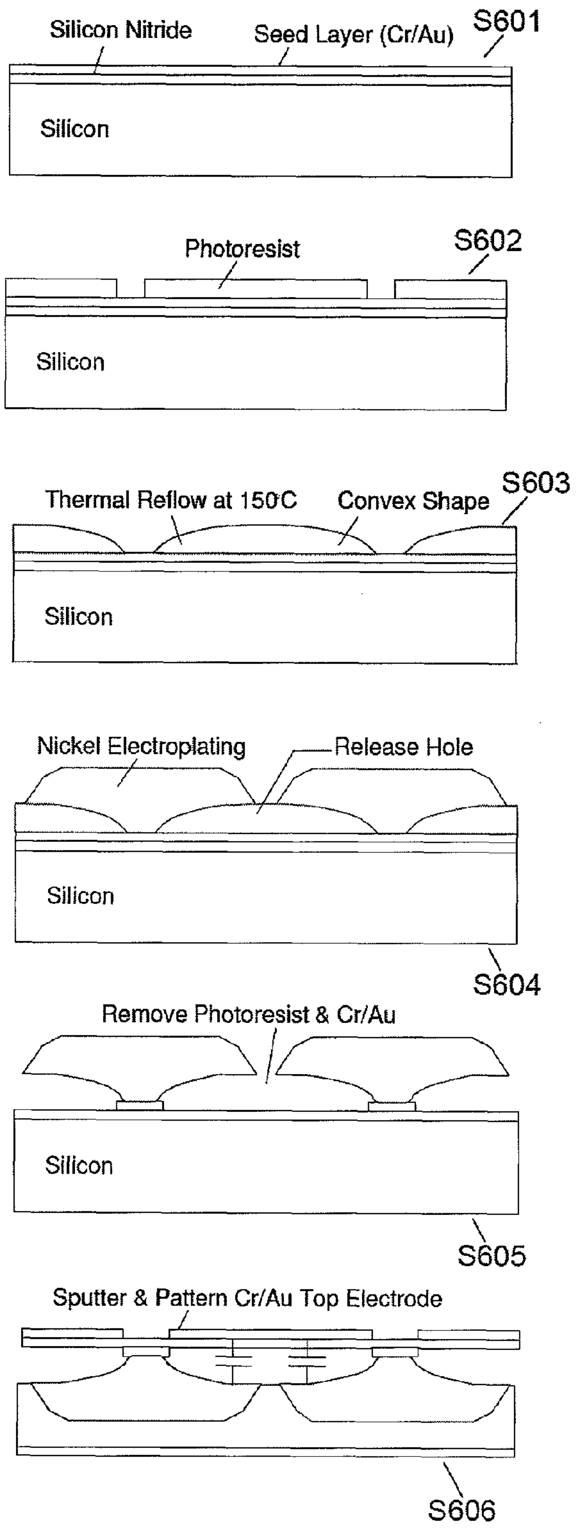
FIG. 15 illustrates an exemplary fabrication process of CMUT arrays with concave bottom electrodes.

FIG. 15 illustrates a method of fabricating CMUT arrays with concave bottom electrodes. The fabrication starts with step S601 using a silicon wafer that includes a layer of silicon nitride to serve as the CMUT membrane. The Young's modulus of the silicon nitride is around 200 GPa. In step S602, a layer of Cr/Au is sputtered to serve as the seed layer for electroplating. Photoresist is coated by a spin coater to get a thickness of around 1 μm and patterned to define the active area of the CMUT cell. Next, in step S603, a thermal reflow process is carried out at 150° C. for 30 minutes to melt the patterned photoresist to form a spherical profile by surface tension. In step S604, electroplating of nickel is performed with the Cr/Au seed layer to form the bottom electrode by over-plating to cover the photoresist sacrificial layer. Step S605 illustrates that the electroplating leaves a small hole for removal of photoresist and Cr/Au in the cavity.

Finally, in step S606, the released holes are first sealed by silicone-based polydimethylsiloxane (PDMS) with air trapped in CMUT cavities. This is followed by a coating of parylene C in a vacuum chamber. The vacuum chamber sucks the trapped air out through the gas permeable PDMS for vacuum sealed cavities since parylene is not gas permeable. The silicon substrate is then removed by single-side potassium hydroxide (KOH) etching that stops at the silicon nitride membrane. This eliminates the membrane stiction problem because the cavity remains dry during the wet etching with the protection of the PDMS and parylene coating. The PDMS now serves as the flexible substrate with silicon nitride membrane ready to be deposited with the metal for the top electrode. The PDMS is then patterned to define the membrane area and array elements. After wire bonding to front-end electronics, the CMUT array is ready to be used.

It will be appreciated by persons skilled in the art that numerous variations and/or modifications may be made to the invention as shown in the specific embodiments without departing from the scope or spirit of the invention as broadly described. The present embodiments are, therefore, to be considered in all respects illustrative and not restrictive.

What is claimed is:

1. A Capacitive Micromachined Ultrasonic Transducer (CMUT) comprising:

a membrane operatively connected to a top electrode; and a bottom electrode having a concave void;

wherein the membrane is configured to deflect towards the bottom electrode when a DC bias voltage is applied such that a peripheral edge region of the membrane is brought into close proximity with the bottom electrode and an electrostatic force proximal to the peripheral edge region of the membrane is increased.

2. The CMUT according to claim 1, wherein when the DC bias voltage is applied, the distance between the peripheral edge region of the membrane and the bottom electrode is less than a distance between a central region of the membrane and the bottom electrode.

3. The CMUT according to claim 1, wherein when the DC bias voltage applied is above a predetermined amount to collapse the membrane towards the bottom electrode, contact between the membrane and the bottom electrode is minimized to a central region of the membrane.

4. The CMUT according to claim 3, wherein about 25% of the membrane is in contact with the bottom electrode when the membrane is collapsed towards the bottom membrane.

5. The CMUT according to claim 1, wherein the top electrode has the same diameter as the void of the bottom electrode.

6. The CMUT according to claim 1, wherein the membrane is flat or deflected.

7. The CMUT according to claim 1, wherein the size of the membrane is from about 500 μm to 5 μm with a frequency range from 100 kHz up to 100 MHz in air.

8. The CMUT according to claim 1, wherein the thickness of the membrane is from about 0.1 μm to 10 μm.

9. The CMUT according to claim 1, wherein the CMUT has an array of membranes where each top electrode fills the entire area of each membrane thereby leaving only small voids for anchoring each membrane.

10. A method for manufacturing a Capacitive Micromachined Ultrasonic Transducer (CMUT), the method comprising:

sputtering a layer of Cr/Au as a seed layer on a silicon substrate that includes a layer of silicon nitride to form a CMUT membrane;

coating a patterned photoresist to define an active area of a CMUT cell;

melting the patterned photoresist to form a spherical profile by surface tension; and electroplating of nickel with the seed layer to form the bottom electrode by over-plating to cover the patterned photoresist.

11. The method according to claim 10, wherein a Young's modulus of the silicon nitride is around 200 GPa.

12. The method according to claim 10, further comprising the step of sealing released holes caused by the electroplating using a silicone-based polydimethylsiloxane (PDMS) with air trapped in CMUT cavities.

13. The method according to claim 10, further comprising the step of coating parylene C in a vacuum chamber.

14. The method according to claim 10, further comprising the step of removing the silicon substrate by single-side potassium hydroxide (KOH) etching that stops at the silicon nitride membrane.

15. The method according to claim 12, further comprising the step of patterning the PDMS to define a membrane area and array elements.

16. The method according to claim 10, further comprising the step of wire bonding to front-end electronics.

* * * * *